(12) United States Patent
Sun et al.

(10) Patent No.: US 7,146,583 B1
(45) Date of Patent: Dec. 5, 2006

(54) METHOD AND SYSTEM FOR IMPLEMENTING A CIRCUIT DESIGN IN A TREE REPRESENTATION

(75) Inventors: Richard Yachyang Sun, Mountain View, CA (US); Daniel J. Downs, Longmont, CO (US); Raymond Kong, San Francisco, CA (US); John J. Laurence, Westminster, CO (US)

(73) Assignee: Xilinx, Inc., San Jose, CA (US)

( * ) Notice: Subject to any disclaimer, the term of this patent is extended or adjusted under 35 U.S.C. 154(b) by 96 days.

(21) Appl. No.: 10/912,999

(22) Filed: Aug. 6, 2004

(51) Int. Cl.
G06F 17/50 (2006.01)
(52) U.S. Cl. ............................................. 716/3; 716/16
(58) Field of Classification Search .................. 716/13, 716/3, 16
See application file for complete search history.

(56) References Cited

U.S. PATENT DOCUMENTS

| | | | |
|---|---|---|---|
| 5,661,663 A * | 8/1997 | Scepanovic et al. ........... 716/8 |
| 5,778,216 A * | 7/1998 | Venkatesh ................... 713/503 |
| 5,867,396 A | 2/1999 | Parlour | |
| 5,930,500 A * | 7/1999 | Scepanovic et al. .......... 716/13 |
| 6,490,717 B1 | 12/2002 | Pedersen et al. | |
| 6,539,533 B1 | 3/2003 | Brown, III et al. | |
| 6,574,788 B1 | 6/2003 | Levine et al. | |
| 6,622,291 B1 * | 9/2003 | Ginetti ........................ 716/9 |
| 2002/0016952 A1 | 2/2002 | Chang et al. | |
| 2004/0078767 A1 * | 4/2004 | Burks et al. .................... 716/8 |
| 2004/0098689 A1 | 5/2004 | Weed | |
| 2004/0225972 A1 | 11/2004 | Oeltjen et al. | |
| 2005/0114818 A1 | 5/2005 | Khakzadi et al. | |
| 2005/0149898 A1 | 7/2005 | Hakewill et al. | |

OTHER PUBLICATIONS

"Development System Reference Guide" from Xilinx Inc., 2100 Logic Drive, San Jose, CA. 95124, Copyright 1994-2003, which has Web address http://toolbox.xilinx.com/docsan/xilinx6/books/data/docs/dev/dev0001_1.html.
"Constraints Guide", ISE 6.1i from Xilinx Inc., 2100 Logic Drive, San Jose, CA. 95124, Copyright 1994-2003, which has Web address http://toolbox.xilinx.com/docsan/xilinx6/books/data/docs/cgd/cgd0001_1.html).
U.S. Appl. No. 10/273,448, filed Oct. 17, 2002, Anderson.
U.S. Appl. No. 10/812,550, filed Mar. 29, 2004, Aggarwal et al.
U.S. Appl. No. 10/912,957, filed Aug. 6, 2004, Laurence et al.

(Continued)

*Primary Examiner*—Paul Dinh
(74) *Attorney, Agent, or Firm*—Pablo Meles; LeRoy D. Maunu

(57) ABSTRACT

A method of implementing a user integrated circuit (IC) design in a tree representation includes the step of introducing the tree representation for the user IC design in a partitioned manner including at least one sub-design to form a design abstraction of the user design. At least one sub-design can include a sub-design providing for multiple levels of implementation hierarchy. The method can further include the step of traversing the design abstraction in a top-down fashion to provide functions selected among floor planning, port assignment, and timing budgeting for at least one sub-design, and the step of traversing the design abstraction in a bottom-up fashion to facilitate at least one among resolution of resource conflicts and parallel processing of multiple sub-designs. Traversing the design abstraction in the bottom-up fashion can facilitate a re-budgeting of timing for the integrated circuit design.

8 Claims, 8 Drawing Sheets

OTHER PUBLICATIONS

U.S. Appl. No. 10/913,000, filed Aug. 6, 2004, Kong et al.
U.S. Appl. No. 10/913,746, filed Aug. 6, 2004, Downs et al.
U.S. Appl. No. 10/913,752, filed Aug. 6, 2004, Downs et al.
Xilinx, Inc.; "Normal Guided Map"; downloaded on Feb. 9, 2006 from http://toolbox.xilinx.com/docsan/xilinx5/data/docs/dev/dev0058_12.html; pp. 1-2.
Xilinx, Inc.; "Normal Guided Par"; downloaded on Feb. 9, 2006 from http://toolbox.xilinx.com/docsan/xilinx5/data/docs/dev/dev0078_14.html; pp. 1-3.
Xilinx, Inc.; "Incremental Design User Guide"; downloaded on Feb. 9, 2006 from http://toolbox.xilinx.com/docsan/xilinx5/data/docs/dev/dev0018_7.html; pp. 1.
Xilinx, Inc.; "Modular Design User Guide"; downloaded on Feb. 9, 2006 from http://toolbox.xilinx.com/docsan/xilinx5/data/docs/dev/dev0022_8.html; pp. 1-2.

Xilinx, Inc.; "Partial Reconfiguration Use of Area Groups"; downloaded on Apr. 5, 2006 from http://toolbox.xilinx.com/docsan/xilinx5/data/docs/dev/dev0028_8.html; pp. 1-5.

Xilinx, Inc.; "Partial Reconfiguration Use of Design Assembly Flow"; downloaded on Feb. 9, 2006 from http://toolbox.xilinx.com/docsan/xilinx5/data/docs/dev/dev0027_8.html; pp. 1-5.

* cited by examiner

Sample I-Set w/ 1-to-many mapping to netlist entities. 34

Sample I-Set w/ 1-to-many mapping to netlist entities. 44

```
...
PIN "ALU.A(3)" LOC = "SLICE_X85Y66" ;        /―152
PIN "ALU.A(2)" LOC = "SLICE_X85Y66" ;
PIN "ALU.A(1)" LOC = "SLICE_X84Y66" ;
PIN "ALU.A(0)" LOC = "SLICE_X84Y66" ;        /―154
PIN "ALU.ALUop(2)" LOC = "SLICE_X58Y35" ;
PIN "ALU.ALUop(1)" LOC = "SLICE_X58Y35" ;
PIN "ALU.ALUop(0)" LOC = "SLICE_X59Y35" ;
AREA_GROUP "AG_ALU" RANGE = SLICE_X53Y63:SLICE_X86Y36 ;  ―156
AREA_GROUP "AG_ALU" RANGE = TBUF_X54Y63:TBUF_X86Y36 ;    ―158
INST ALU AREA_GROUP = AG_ALU ;———————————————————160
AREA_GROUP "AG_ALUcontrol" RANGE = SLICE_X58Y35:SLICE_X75Y18 ;
AREA_GROUP "AG_ALUcontrol" RANGE = TBUF_X58Y35:TBUF_X74Y18 ;
INST ALUcontrol AREA_GROUP = AG_ALUcontrol ;————————162
AREA_GROUP "AG_ALUOut_register" RANGE = SLICE_X87Y58:SLICE_X95Y36 ;
AREA_GROUP "AG_ALUOut_register" RANGE = TBUF_X88Y58:TBUF_X94Y36 ;
AREA_GROUP "AG_ALUOut_register" RANGE = RAMB16_X3Y6:RAMB16_X3Y5 ;
AREA_GROUP "AG_ALUOut_register" RANGE =
MULT18X18_X3Y6:MULT18X18_X3Y5 ;              /―164
INST ALUOut_register AREA_GROUP = AG_ALUOut_register ;
...
```

EXPRESSING A DESIRED HIERARCHICAL RELATIONSHIP IN A FORM OF PARENT-CHILD PAIRS WHERE A PARENT SUB-DESIGN IS DEPENDENT UPON A CHILD SUB-DESIGN AND THE DESIRED HIERARCHICAL RELATIONSHIP IS A DESIGN ABSTRACTION OF AN IC DESIGN FORMING AN IMPLEMENTATION TREE  202

↓

TRAVERSING THE DESIGN ABSTRACTION IN A TOP-DOWN FASHION TO PROVIDE FUNCTIONS SELECTED AMONG FLOOR PLANNING, PORT ASSIGNMENT, AND TIMING BUDGETING FOR THE AT LEAST ONE SUB-DESIGN  204

↓

TRAVERSING THE DESIGN ABSTRACTION IN A BOTTOM-UP FASHION TO FACILITATE AT LEAST ONE AMONG RESOLUTION OF RESOURCE CONFLICTS AND PARALLEL PROCESSING OF MULTIPLE SUB-DESIGNS  206

↓

TRAVERSING THE DESIGN ABSTRACTION IN THE BOTTOM-UP FASHION FURTHER FACILITATES A RE-BUDGETING OF TIMING FOR THE IC DESIGN.  208

↓

RE-IMPLEMENTING A SUB-DESIGN AFFECTED BY ATTEMPTS TO RESOLVE RESOURCE CONFLICTS OR RE-BUDGET OF TIMING  210

↓

DIVIDING THE IC DESIGN INTO A PLURALITY OF SUB-DESIGNS  212

↓

DEFINING THE TREE IMPLEMENTATION USING LEGALLY DEFINED USER SELECTED SUB-SETS OF SUB-DESIGNS AMONG THE PLURALITY OF SUB-DESIGNS  214

↓

IDENTIFYING AMONG A PLURALITY OF SUB-DESIGNS, SUB-DESIGNS THAT ARE INDEPENDENT SETS, WHEREIN NO NODE IN AN INDEPENDENT SET IS A DESCENDENT OF ANOTHER NODE IN THE SAME SET  216

↓

IMPLEMENTING THE IDENTIFIED INDEPENDENT SETS IN PARALLEL  218

↓

RECURSIVELY FORMING TOOL-GENERATED CLUSTERS IN CASES WHERE SUB-DESIGNS ARE TIGHTLY COUPLED OR WHERE SUB-DESIGNS CONTAIN A PORTION OF A CRITICAL TIMING PATH.  220

METHOD AND SYSTEM FOR IMPLEMENTING A CIRCUIT DESIGN IN A TREE REPRESENTATION

BACKGROUND

1. Field of the Invention

The invention relates to the field of circuit design and, more particularly, to the use of implementation sets in a tree representation for implementing a circuit design.

2. Description of the Related Art

Circuit designs, and particularly designs for Field Programmable Gate Arrays (FPGA's), have become increasingly complex and heterogeneous. The rapid increase of FPGA design complexity and size has driven several complex Xilinx FPGA devices to accommodate a few million gates. Modern circuit designs can include a variety of different components or resources including, but not limited to, registers, block Random Access Memory (RAM), multipliers, processors, and the like. This increasing complexity makes design tools, maintenance of design tools as well as placement and signal routing of circuit designs more cumbersome. Existing design tools can have multiple flows that fail to be uniform, further adding to the complexity in the tools and their maintenance. Furthermore, existing design tools fail to provide sufficient flexibility in terms of representing design granularity in a particular design.

With such an enormous increase in device capacity and complexity, the traditional flattened design implementation methodology is faced with challenges in obtaining a good design implementation in an acceptable time frame. Since the design is flattened and implemented all at once in the traditional flattened design implementation methodology, a design of large size can easily cause a sophisticated algorithm employed in a tool flow to fail in the run-time without guaranteeing a good solution. Consequently, a divide-and-conquer methodology is usually considered for difficult and perhaps sometimes impossible large design implementations. In a divide-and-conquer methodology, the design is first divided into several sub-designs. Since each sub-design is only a small portion of the original design, a good implementation can be obtained in a fairly reasonable amount of time. Then, a complete implementation of the entire design can be formed by assembling the implementations for the sub-designs.

Xilinx software implementation tools currently support a number of user flows including a "conventional flow" and a set of "user interactive" flows. The conventional flow is characterized by a single design iteration while the user interactive flows require two (2) or more design iterations through the tools. These user interactive flows refer to a collection of 5 flows, namely Normal Guide Exact flow, Normal Guide Leverage flow, Incremental Design flow, Modular Design flow, and Partial Reconfiguration flow. Each flow addresses a specific set of customer needs.

For Normal Guide Exact flow, its primary use is to incorporate design changes based upon a previous physical implementation where the underlying objective is to incorporate the changes while preserving the performance of the previous implementation. As for Normal Guide Leverage and Incremental Design flows, their primary applications are also to incorporate and implement design changes to an existing design. However, the objective for Normal Guide Leverage and Incremental Design flow is to minimize the overall implementation run-time.

For Modular Design flow (and its derived variations such as Partial Reconfiguration flow), it serves two primary use cases, namely: (1) to provide a software infrastructure that allows for a divide-and-conquer approach used to manage design complexity by tackling smaller sub-designs; and (2) to provide a software infrastructure to support a parallel team design environment where a single design is divided into sub-designs. In turn, each partitioned sub-design is implemented independently by different team members. The final design is then assembled from previously implemented sub-designs. During the assembly phase, the user can choose to assemble the implemented sub-designs all at once or one sub-design at a time. When the implemented sub-designs are assembled sequentially, the user can specify a preferred ordering of sub-designs to follow during the assembly process. This sequential assembly process allows the user to be able to examine the quality of each intermediate partially assembled implementation. If a partially assembled implementation fails to meet all the design goals, re-implementing sub-design(s) can start early, instead of at the end of the assembly.

Lastly, the Partial Reconfiguration flow takes advantage of the underlying Xilinx FPGA device feature of partial bit stream re-programming which allows for the loading of a partial bit stream onto a Xilinx FPGA device while it is active and operational on the unchanged bit stream portion. From a software perspective, the Partial Reconfiguration flow is supported as a sub-flow or a variation of the Modular Design flow.

Due to historical reasons, each of the user interactive flows has been designed separately and for the most part defect driven. The evolution of these flows has taken separate and independent paths. Without a common theme among these user interactive flows, it was inevitable that the relevant concepts, methodology, and implementation became fractured. As a result, inefficiencies arose and customer flow complexity increased. Each interactive flow required a different set of knowledge, terminology, and procedure that posed as an obstacle to ease-of-use. In addition, the internal implementation increased in the development overhead as each user interactive flow was supported separately.

One of the root causes identified for why the prior interactive flows diverged was that each interactive flow operated on a different notion or implementation of how a partial net-list is specified. Specifically, under Incremental Design flow, the partial net-list of interest is specified by the contents of an Area Group. Similarly, under Modular Design and Partial Reconfiguration flows, the partial net-list is specified by either an Active Module or a previously implemented module (or PIM). Lastly, under Normal Guide Exact, Leverage, and conventional flows, the partial net-list is given by the entire design. As the result, the client application implementations became dependent of each flow and required the software overhead of understanding and processing the various data representations. In addition, due to the complexity of each interactive flow, the software maintenance and enhancements became an increasing overhead and burden on engineering staff resources. Furthermore, there were other notions of partial net-lists in the software system such as: modules, hard macro, and soft Intellectual Property (IP) core. Each of these design entities were implemented and supported separately. As the software system evolves with an increasing number of these design entities, the resulting software complexity and impact will be significant.

Many of the tasks performed in these interactive flows relate to working with containers of grouped logic. Flows are determined in part by user specified command line parameters and user-specified constraints. Point tools read the parameters from the command line and the constraint file, and operate on the groups of logic with algorithms that are dependent on the particular flow that is being followed. The algorithms are fractured and branch into other algorithms depending on characteristics such as the flow information and the additional parameters that defines the grouped logic. As noted above, changes to the flow definition may require extensive modification to underlying algorithms.

In existing systems, individual point tools would use flow information to change the behavior of algorithms. For example, a tool may need to know if it should guide all of a container of logic, or none of it. The tool would determine the flow, and perhaps not guide the container if it had a change to the logic and it was in the Incremental Design flow. In other words, flow information was interspersed widely throughout the point tools' algorithms. For instance, in the Modular Design flow, Place and Route tools read data from the command line, but the existence of Active Modules in the design database would invoke a different algorithm than was originally being processed. The distributed nature of flow information throughout the algorithms has many disadvantages. A specified flow is a very high level concept that affects many low-level decisions. Any changes to the high-level flow information will result in changes to the code in many different places that can result in costly coding errors. Relatively minor changes to the flow can result in major modifications to the underlying algorithms. Consequently, it is difficult to support new flows or modify existing flows.

SUMMARY OF THE INVENTION

The notion of Implementation Set (I-Set) is being introduced to provide a common and singular paradigm for which all interactive flows can operate upon. I-Set exploits the notion of implementation granularity and provides a flow independent concept to how a partial net-list is specified. In other words, embodiments in accordance with the invention removes dependencies between high-level flow requirements and low-level tasks as it relates to the electronic design process for integrated circuits. By providing a unifying data model such as I-Set, client applications (such as design tools) can significantly simplify their interface to the underlying net-list information. Effectively, client applications no longer need to distinguish between different net-list entities such as user floor planned partitioning (e.g., area groups), modules, and flat designs in its implementation. Client applications such as design implementation tools can focus solely on I-Sets instead of being concerned with flow information and the different net-list entities associated with partial net-lists. A software tool can be used to determine a list of (flow independent) tasks needed to manipulate the containers. Furthermore, embodiments in accordance with the present invention involves the I-Sets and the introduction of a tree representation to represent the implementation dependencies among portions of the design and its use for various design implementation methodologies. To implement portions of the design sequentially and to complete the implementation of the entire design, two systematic ways to traverse the implementation tree can be used where each traversal generates an implementation sequence. To implement portions of a design in parallel, a proposed implementation tree can be used to identify the sets of partial designs that can be implemented independently. The methods introduced herein can apply to software programs that implement IC designs including, but not limited to PLD, ASIC, and gate array designs implementations.

An exemplary embodiment of the present invention involves a method of implementing a user integrated circuit (IC) design in a tree representation including the steps of introducing the tree representation for the user IC design in a partitioned manner including at least one sub-design to form a design abstraction of the user design. At least one sub-design can include a sub-design providing for multiple levels of implementation hierarchy. The method can further include the step of traversing the design abstraction in a top-down fashion to provide functions selected among floor planning, port assignment, and timing budgeting for at least one sub-design, and the step of traversing the design abstraction in a bottom-up fashion to facilitate at least one among resolution of resource conflicts and parallel processing of multiple sub-designs. The step of traversing the design abstraction in the bottom-up fashion can also facilitate a re-budgeting of timing for the integrated circuit design. Note, the user IC design can be for FPGAs, ASICs, PLDS, or other IC devices.

In another embodiment of the present invention a method of implementing an IC design includes the step of expressing a desired hierarchical relationship in a form of parent-child pairs where a parent sub-design is dependent upon a child sub-design and the desired hierarchical relationship is a design abstraction of the IC design forming an implementation tree. The method further includes the step of traversing the design abstraction in a top-down fashion to provide functions selected among floor planning, port assignment, and timing budgeting for the at least one sub-design and the step of traversing the design abstraction in a bottom-up fashion to facilitate at least one among resolution of resource conflicts and parallel processing of multiple sub-designs.

In yet another embodiment of the present invention, a integrated circuit design implementation tool for designing integrated circuits can include a memory and a processor. The processor can be programmed to implement an integrated circuit design using an implementation tree having a rooted tree with a plurality of nodes that represents an implementation hierarchy among sub-designs in a design abstraction of the integrated circuit design. The processor can be further programmed to traverse the design abstraction in a top-down fashion to provide functions selected among floor planning, port assignment, and timing budgeting for the at least one sub-design and traverse the design abstraction in a bottom-up fashion to facilitate at least one among resolution of resource conflicts and parallel processing of multiple sub-designs.

Further note that each implementation set can be treated separately and implemented independently and that multiple abstractions can be made for the same user design by specifying an alternative plurality of implementation sets for the integrated circuit design.

Other embodiments of the present invention, when configured in accordance with the inventive arrangements disclosed herein, can include a system for performing, and a machine readable storage for causing a machine to perform, the various processes disclosed herein.

BRIEF DESCRIPTION OF THE DRAWINGS

There are shown in the drawings, embodiments which are presently preferred, it being understood, however, that the invention is not limited to the precise arrangements and instrumentalities shown.

FIG. 5C shows part of a user constraint file (UCF).

FIG. 11 is a flow chart illustrating a method of implementing an integrated circuit design in accordance with another embodiment of the inventive arrangements disclosed herein.

DETAILED DESCRIPTION OF THE INVENTION

The present invention provides a solution for simplifying the implementation of circuit designs and associated maintenance without limiting or restricting granularity by using an abstraction called implementation sets or I-Sets.

Figure 1:
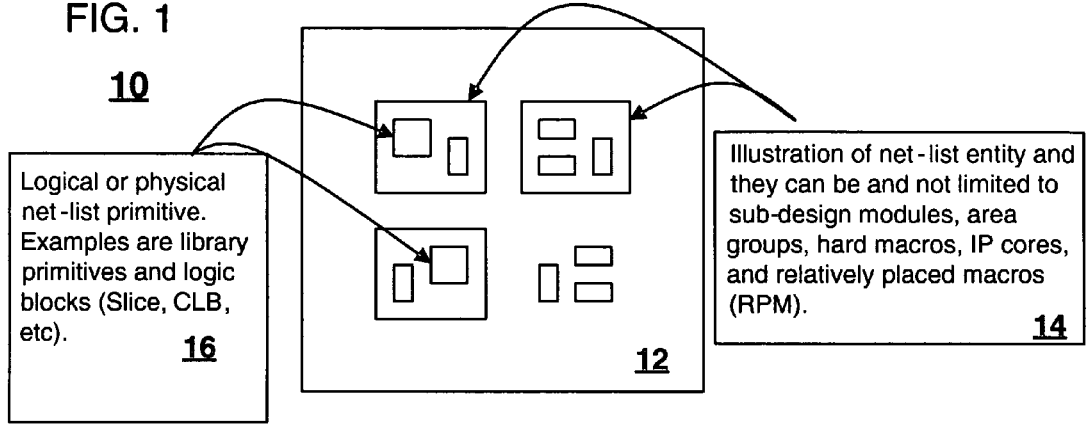
FIG. 1 is a sample design illustrating net-list entities and logical or physical net-list primitives in accordance with one embodiment of the inventive arrangements disclosed herein.

Circuit designs or circuit design representations can include any physical description of a circuit design in terms of the components to be used, including but not limited to, net-lists, circuit descriptions conforming to open standards such as the Berkeley Logic Interchange Format (BLIF), as well as circuit descriptions conforming to proprietary standards such as Native Circuit Description as used by Xilinx, Inc. of San Jose, Calif. For example, as shown in FIG. 1, a sample circuit design representation 10 can include a circuit design 12 having a plurality of net-list entities 14 such as sub-design modules, user floor planned partitions (e.g., area groups), hard macros, IP cores, and relatively placed macros each having logical or physical net-list primitives 16 such as library primitives and logic blocks such as slices and configurable logic blocks (CLBs). For simplicity, user floor-planned partitioning or area groups, active modules, inactive modules, PIMs, hard macros, soft IP cores, and relatively placed macros (RPMs) can be generically referred to as net-list entities or logic blocks.

An I-Set can be an abstraction that contains and/or references all necessary design information to implement a specific portion of a single design or a sub-design. In other words, an I-Set can be considered a container of net list logic that can include either a portion of a design or an entire design. Without loss of generality, the sub-design may represent a single design in its entirety. An I-Set has several important aspects including partial net list information and implementation directives. The emphasis of this application relates to partial net list information which is further elaborated herein as it pertains to a specific problem or design.

Each I-Set contains a list of net-list blocks and a list of signals that are incident to and are coupled to those blocks. A single design can be expressed by a collection of I-Sets where each I-Set represents a portion of the entire design net-list. Conversely, a collection of I-Sets can represent an entire net list associated with a single design. The I-Set abstraction provides an alternative grouping of the user design logic that is more suitable for a particular implementation flow or an implementation tool in question. I-Sets can be created based on user design constraints and/or internally based upon an implementation tool's needs. Note that the I-Set abstraction does not alter the underlying design hierarchy. Further note that one or more I-Sets can exist for a given user design.

An implementation set contains a list of blocks and signals such that the member blocks and signals are hierarchical. In other words, each member block and signal can contain one or more child descendents. Basically, the implementation set concept can apply to a design that is expressed hierarchically. An I-Set abstraction can be organized in a hierarchical manner such that each I-Set can have one or more child descendent I-Sets. In addition, the parent/child relations can be expressed as implementation dependencies. Specifically, all child logic must be implemented before any of its parent logic in the bottom-up implementation methodology. Likewise, all child logic cannot be implemented before any of its parent logic in the top-down implementation methodology. Note that sibling I-Sets can be implemented in parallel since there are no parent/child relations among them.

Figure 2:
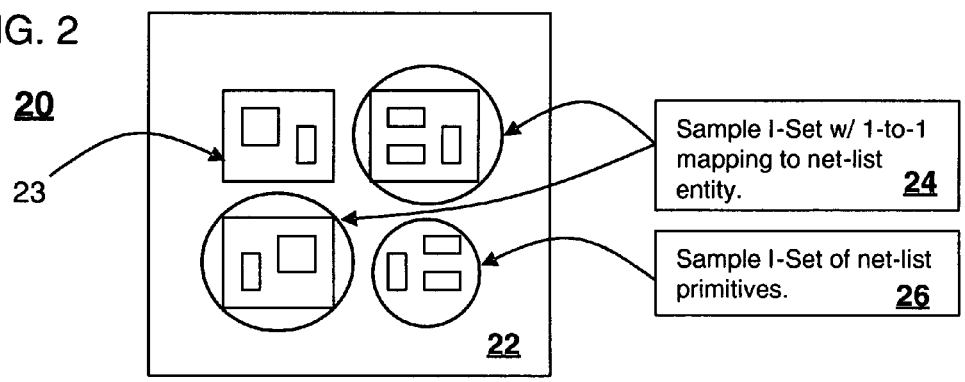
FIG. 2 is the sample design of FIG. 1 illustrating a sample I-Set with a one-to-one mapping to net-list entity in accordance with one embodiment of the inventive arrangements disclosed herein.
Figure 3:
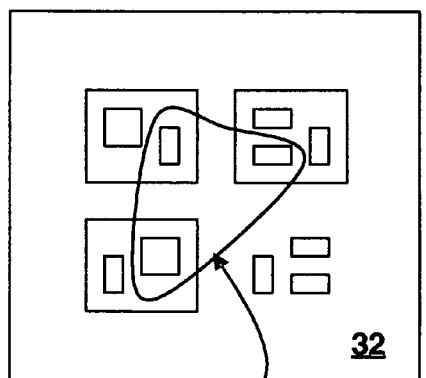
FIG. 3 is the sample design of FIG. 1 illustrating a sample I-Set with a one-to-many mapping to net-list entities in accordance with one embodiment of the inventive arrangements disclosed herein.
Figure 4:
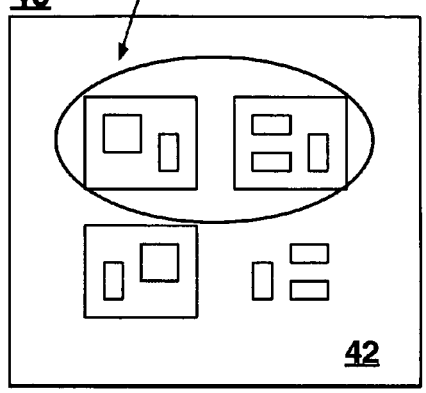
FIG. 4 is the sample design of FIG. 1 illustrating another sample I-Set with a one-to-one mapping to net-list entities in accordance with one embodiment of the inventive arrangements disclosed herein.

Each I-Set contains a list of net-list blocks and a list of signals that are incident to and are connected to those blocks. In one embodiment, each I-Set corresponds to a net-list entity and maintains a 1-to-1 mapping as shown in FIG. 2 where a circuit design representation 20 includes a circuit design 22 with sample I-Sets 24 that have a one-to-one mapping to net-list entity. I-Set 26 illustrates a sample I-Set of net-list primitives. In another embodiment with two variations as shown in FIGS. 3 and 4 having circuit design representations 30,40 and circuit designs 32,42 respectively, each I-Set corresponds to more than one net-list entities, thus maintaining a 1-to-many mapping. In FIG. 4, the net-list entity is referenced by a corresponding I-Set 44 in its entirety. Whereas, in the FIG. 3, each I-Set 34 can contain the partial contents of a net-list entity. Thus, it follows that I-Set mapping is not restricted to follow the membership boundary as posed by each net-list entity.

Figure 2A:
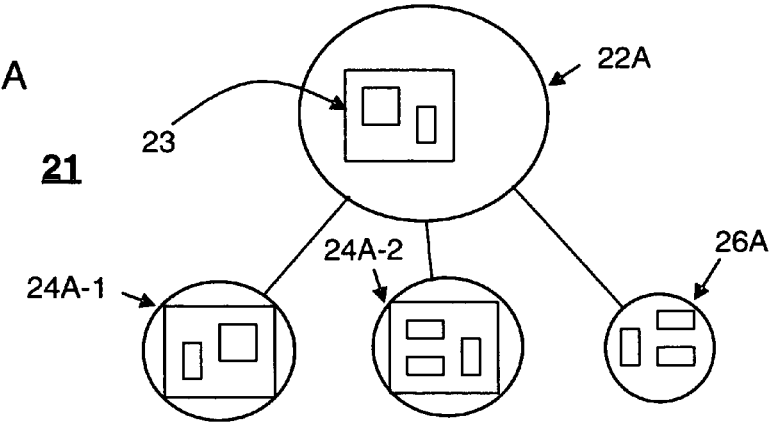
FIG. 2A is an implementation tree corresponding to the sample I-Set and hierarchy of FIG. 2.
Figure 3A:
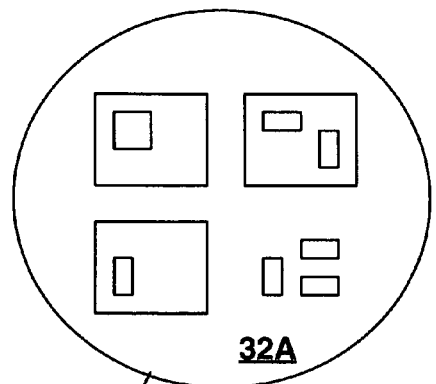
FIG. 3A is an implementation tree corresponding to the sample I-Set and hierarchy of FIG. 3.
Figure 4A:
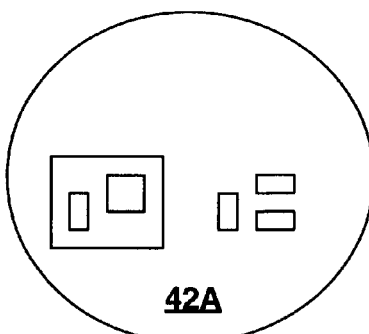
FIG. 4A is an implementation tree corresponding to the sample I-Set and hierarchy of FIG. 4.

Referring to FIGS. 2A, 3A, and 4A, I-Set trees 21, 31, and 41 correspond to the user or circuit designs 22, 32, and 42. Note, that although each user design is the same in each case, multiple I-Set trees having different I-Set configurations and hierarchies can be created. In one instance, I-set tree 21 includes child I-Sets 24A and 26A coupling to a top-level I-Set 22A. I-Set 22A includes all other elements (e.g., net-list entity 23) not otherwise included in child I-Sets 24A-1, 24A-2, and 26A. I-Set tree 31 includes child I-Set 34A coupling to top-level I-Set 32A. I-Set 32A includes all other elements not otherwise included in child I-Set 34A (where I-Set 34A has the three net-list primitives shown in set 34 of FIG. 3). I-Set tree 41 includes child I-Set 44A coupling to top-level I-Set 42A. I-Set 42A includes all other elements not otherwise included in child I-Set 44A (where I-Set 44A has the two net-list entities shown in set 44 of FIG. 4).

The partial net-list information in an I-Set is given by a list of blocks and signals. Each block is represented by but not limited to a net-list primitive or a place-able physical component (e.g. SLICE CLB). In addition, each I-Set contains a list of signals that are incident to or connects to the pins of those blocks. The set of signals is organized into 2 categories, namely "internal" and "external". For any given I-Set, an external sign of the given I-Set refers to a signal that has connectivity to at least one block of the given I-Set or its descendant I-Sets and connectivity to at least one block not in the given I-Set or its descendant I-Sets. An internal signal of a given I-Set refers to a signal that is not an external signal and has connectivity to at least one block in the given I-Set or has connectivity to blocks in at least two child I-Sets or their descendant I-Sets.

Figure 5A:
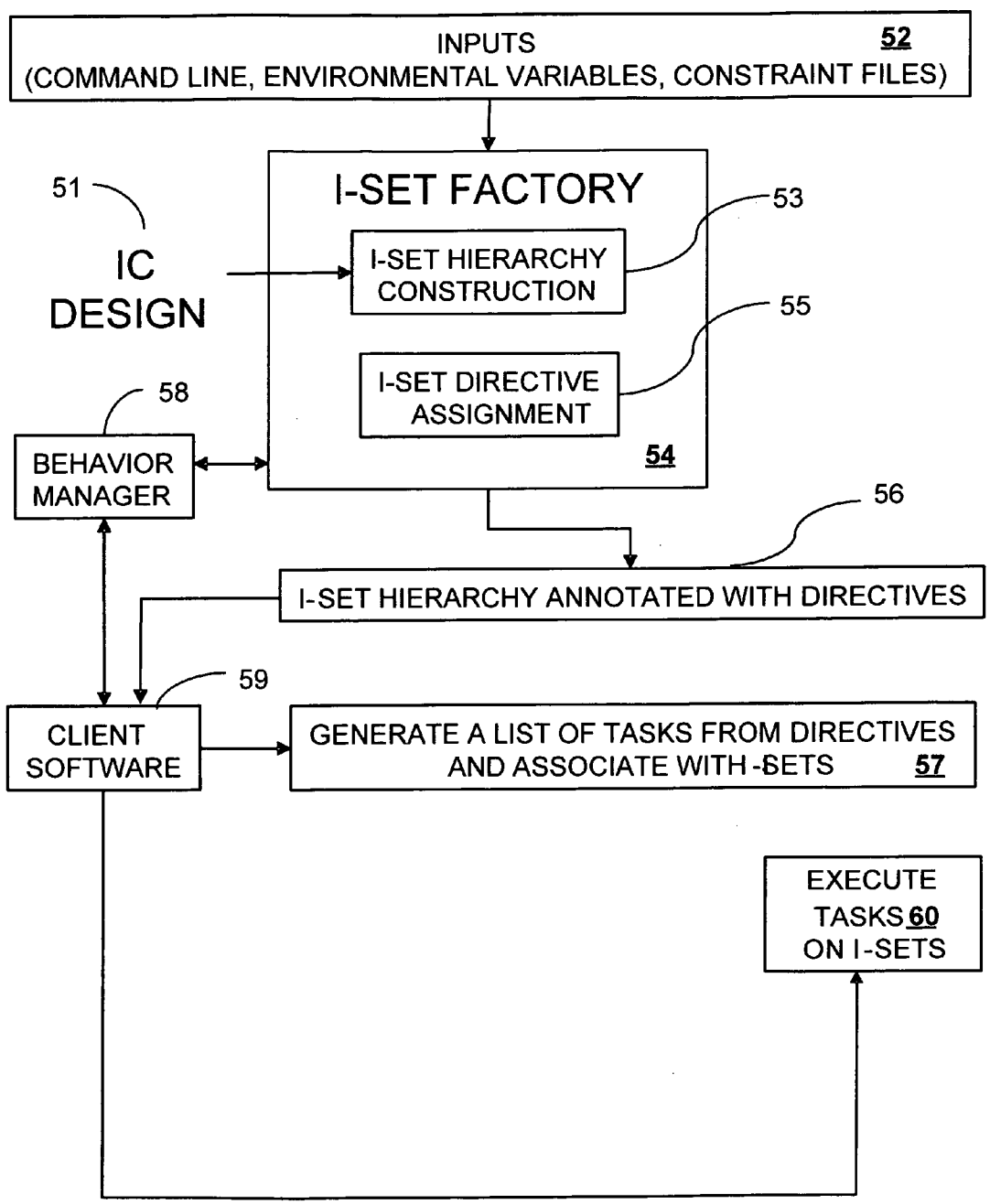
FIG. 5A is a flow chart illustrating the overall creating and use of I-Sets in circuit designs along with client software such as circuit design tools in accordance with the one embodiment of the present invention.
Figure 6:
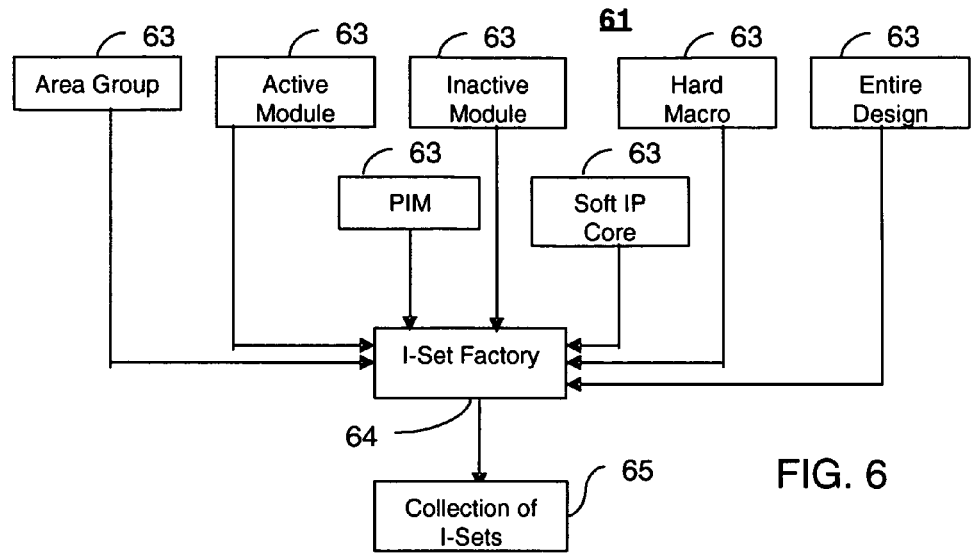
FIG. 6 is a block diagram illustrating how an I-Set factory uses one or more net-list entities as inputs and applies a predefined mapping to create a collection of I-Sets in accordance with one embodiment of the inventive arrangements disclosed herein.

In order to provide a singular representation of a partial net-list, a construction mechanism, referred to as I-Set factory, is introduced. An I-Set factory is shown in FIG. 5A as part of an overall I-Set scheme 50 for creating circuit designs and in a narrower setting 61 in FIG. 6 illustrating the creation of a collection of I-Sets 65. Referring to FIG. 5A, an I-Set Factory 54 in an overall scheme 50 for implementing an integrated circuit design 51 is shown receiving a plurality of inputs 52 such as command line variables, environmental variables, and user constraint files. The I-Set factory 54 can maintain the integrated circuit design hierarchy in an I-Set hierarchy construction 53 and introduce additional I-Set hierarchy that is suitable for a particular implementation flow or a particular design tool. The factor 54 further assigns directives at block 55 in the process of producing a collection of I-Sets 56 which has the I-Set hierarchy annotated with directives which are used by client software 59. In conjunction with a behavior manager 58 and client software 59 (such as circuit design tools), a list of tasks 57 can be generated from the directives which are associated with the collection of I-Sets. Finally, the client software 59 can either direct the execution or execute the tasks on the collection of I-Sets at block 60. Note that an I-Set abstraction can be created using the I-Set factory 54 as a single module in an implementation tool flow process performing both implementation set hierarchy construction (53) and implementation set directive assignment (55).

Figure 5B:
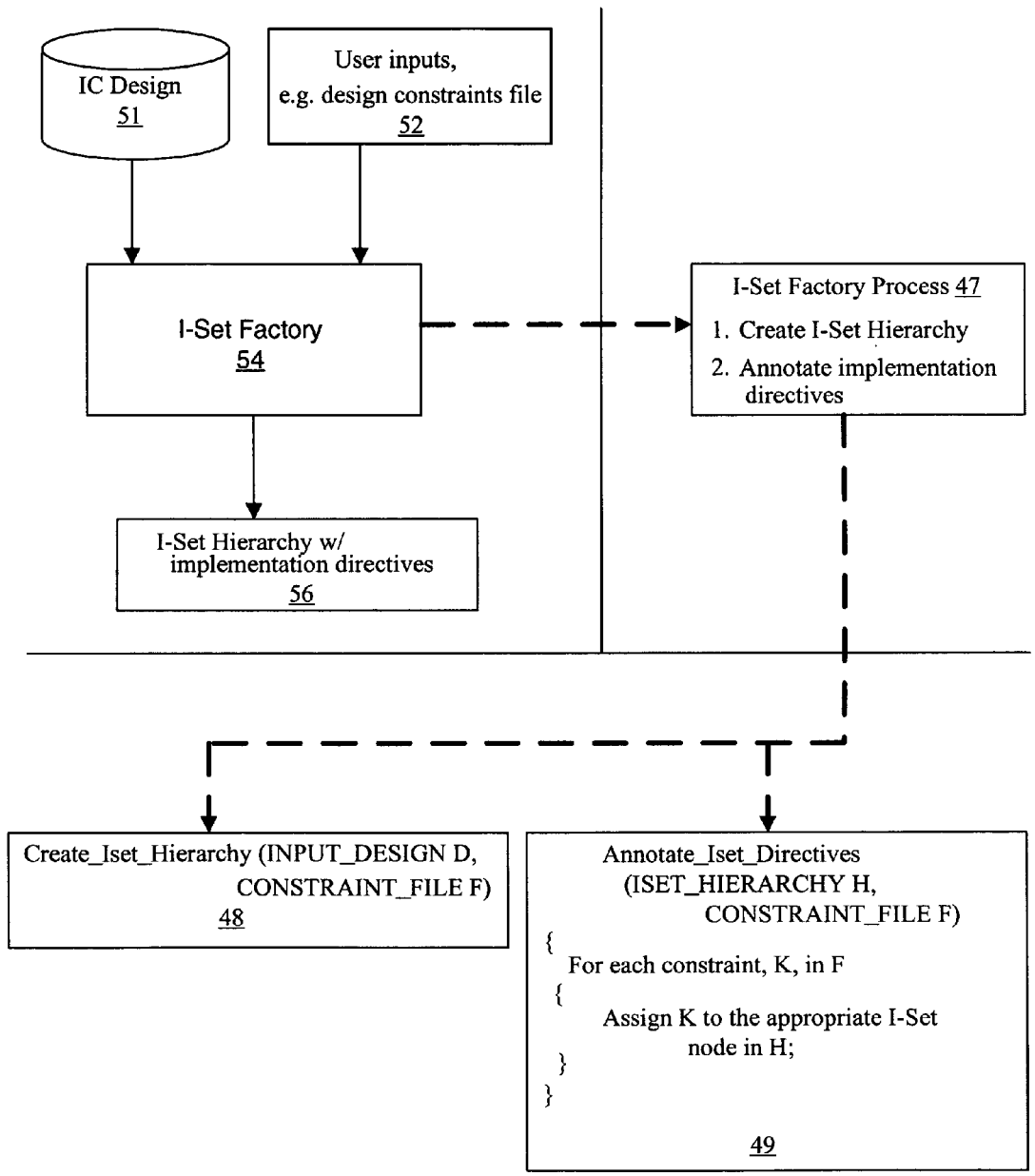
FIG. 5B shows an expanded view of the I-Set Factory of FIG. 5A of an embodiment of the present invention.

FIG. 5B shows an expanded view of the I-Set Factory 54 of an embodiment of the present invention. The same labels are used for FIGS. 5A and 5B where the blocks are the same or similar. The I-Set Factory 54 receives as inputs, the IC design 51 such as a Hardware Description Language (HDL) design created using the "Development System Reference Guide" from Xilinx Inc. of San Jose, Calif., Copyright 1994–2003, which has Web address http://toolbox.xilinx.com/docsan/xilinx6/books/data/docs/dev/dev0001__1.html, and user inputs 52 such as the design constraint file (for example, see the "Constraints Guide", ISE 6.1i from Xilinx Inc. of San Jose, Calif., Copyright 1994–2003, which has Web address http://toolbox.xilinx.com/docsan/xilinx6/books/data/docs/cgd/0001__1.html). The I-Set Factory then produces a directed graph (I-Set hierarchy) whose nodes are annotated with the appropriate constraint in the design constraint file.

The I-Set Factory 54 includes two major functions (I-Set Factory Process 47): creating the I-set hierarchy using the pseudo code function Create_Iset Hierarchy (Input_Design D, Constraint_File_ F) 48, and annotating the nodes of the I-set hierarchy using the pseudo code function Annotate_Iset Directives (Iset_hierarchy H, Constraint_File_F) 49.

The Create_Iset Hierarchy (Input_Design D, Constraint_File_ F) 48 may receive, for example, a HDL input design using a modular design flow and an area group constraint. The input design may be created from a team of engineers that work independently on different pieces or modules of the design and then merge their pieces together to form one design (see Chapter 4 of the "Development System Reference Guide"). The input design can be improved by using an area group constraint, which enables partitioning of the modular design into physical regions for mapping, packing, placement, and routing. In this example, the Create_Iset Hierarchy function first forms the netlist of logic blocks for the input design in a root node. Next using, for example, the area group constraint, a first child I-set node is formed which has a subset of logic blocks from the netlist in the root node. This subset is removed from the root node, so that the netlist of logic blocks for the input design is now contained in the root node and first child node. Other child nodes may be formed. As the Create_Iset Hierarchy is an iterative (or recursive) procedure, each child node may then become a parent node with child nodes and so forth.

The pseudo code for Create_Iset Hierarchy

```
(Input_Design D, Constraint_File_F) is given by:
{
    Create root I-Set node, R
    Add to R all the logic blocks in D
    For each design granularity defined in D and F
    {
        Determine parent I-Set (P) of design granularity
        Create a child I-Set node (C) under P;
        For each logic block member to C
        {
            Remove logic block from I-Set node P
            Add logic block to I-Set node C
        }
    }
}
```

FIG. 5C shows part of a user constraint file (UCF) 150 which is an example of user input 52 in FIG. 5B. The corresponding part of the IC design 51 includes ALU (arithmetic logic unit), ALUcontrol (ALU control circuit), and ALUOut_register (ALU output register) HDL modules. The UCF 150 assigns logic modules and I/Os in the HDL design to physical locations. For example, line 152 assigns the pin location for port A(3) of HDL module ALU to physical location SLICE_X85Y66 and line 154 assigns the pin location for port ALUop(2) of HDL module ALU to physical location SLICE_X58Y35. The area group AG_ALU has two ranges RANGE=SLICE_X53Y63: SLICE_$_x$86Y36 (line 156) and RANGE=TBUF_X54Y63: TBUF_$_x$86Y36 (line 158), where the range for the AG_ALU area group may be the union of these two ranges. Line 160 starting with INST, assigns the HDL logic module ALU in the IC design 51 to area group AG_ALU. In one embodiment with a 1-to-1 mapping, the I-Set Factory 54 assigns the ALU logic module with area group physical constraint AG_ALU to a first I-set. Similarly, in line 162 starting with INST, the HDL logic module ALUcontrol in the IC design 51 is assigned to area group AG_ALUcontrol and in line 164 starting with INST, the HDL logic module ALUOut_register in the IC design 51 is assigned to area group AG_ ALUOut_register. Thus the second I-Set has the ALUcontrol logic module with area group physical constraint AG_ALUcontrol and the third I-Set has the ALUOut_register logic module with area group physical constraint AG_ALUOut_register.

With the introduction of I-Sets, the overall software effort and impact can be significantly minimized. Client applications no longer need to incur the software overhead needed to support the various and increasing number of design entities. In addition, the effort to support the growing list of net-list entities can be substantially reduced by supporting a single abstraction, namely, the I-Set.

Using I-Sets in various tree representations is generally suited for the two divide-and-conquer use cases mentioned above to support design implementation with arbitrary implementation hierarchy. Specifically, a user can first divide the design into sub-designs and provide the desired dependency relations between sub-design implementations. (A sub-design A is said to be dependent on a sub-design B if the sub-design B has to be implemented before sub-design A.) These implementation dependency relations are then expressed in the form of (parent, child) pairs so that the parent sub-design is dependent on the child sub-design. Given a collection of these (parent, child) pairs, a tree structure can be used to represent all the dependencies and breadth-first and depth-first traversal methods can further be used to visit each tree node exactly once. The breadth-first traversal visits tree nodes in the top-down fashion, whereas the depth-first traversal visits in the bottom-up fashion. By following the ordering in which tree nodes are visited in the breadth-first (depth-first) traversal during implementation, the design is implemented in the top-down (bottom-up) implementation methodology accordingly. Therefore, this dependency tree serves as a good infrastructure for all the implementation tools to use during both the top-down and bottom-up design methodologies. Moreover, since this tree structure specifies the dependency relationship between sub-design implementations, an independent set (no node in an independent set is a descendent of another node in the same set) in the tree nodes corresponds to a set of sub-designs that can be implemented in parallel. By extracting maximal independent sets in this tree, we are able to maximize the implementation parallelism in the parallel implementation paradigm.

In hierarchical design implementation, a divide-and-conquer flow is usually used. The design is first divided into sub-designs which can be further divided recursively into even finer sub-designs. After carefully planning, such as timing budgeting among sub-designs, the user is able to implement each sub-design independently and then assemble the results to form the implementation of the entire design. During this process, it can be very important for the user to examine intermediate results to make sure the partial implementations will not prevent from leading to a final implementation that meets all the design goals. An example is given in FIG. 7, where a representation 70 of a design or sub-design A (71) has finer sub-designs B, C, and D and sub-design B has another 3 finer sub-designs E, F, and G. If the implementation of sub-design B dominates the quality of the final implementation in terms of, for instance, area and/or performance, then the user should examine and/or verify the implementation of sub-design B before considering the implementation of sub-design A. Sub-design A is dependent on sub-design B because its implementation cannot be started until the implementation of sub-design B is qualified. Given a collection of dependency relations among sub-designs, it is not hard to see that the dependencies cannot be cyclic because one sub-design cannot be a proper sub-design of itself and two sub-designs cannot depend on the same sub-design. Therefore, a rooted tree structure is proposed herein to represent the dependency relations among sub-designs. Such a rooted tree that represents the implementation dependencies among sub-designs is referred as an implementation tree as shown in implementation tree 80 of FIG. 8. The root (83) of an implementation tree corresponds to the entire design as the whole design is a degenerated sub-design. Moreover, once the desired dependency relations among sub-designs are provided by the user, a topological sorted result can be used to remove all transitive redundant relations. For example, if a sub-design A depends on a sub-design B which depends on a sub-design C and the user also specifies that sub-design A depends upon sub-design C, then the dependency of sub-design A on sub-design C is transitive, and therefore, redundant. To remove these user-specified transitive (redundant) dependency relations, the topological sorting result in the form of a list can be scanned to remove all the transitive relations. The remaining dependency relations then correspond to the edges of the implementation tree.

Figure 7:
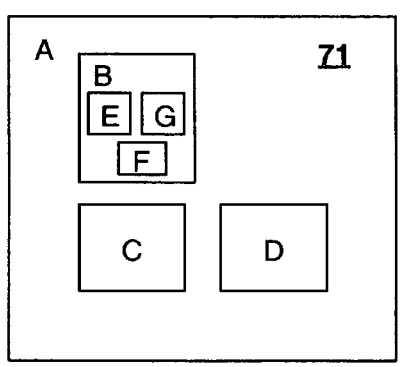
FIG. 7 is a sample design illustrating a set of net list entities.
Figure 8:
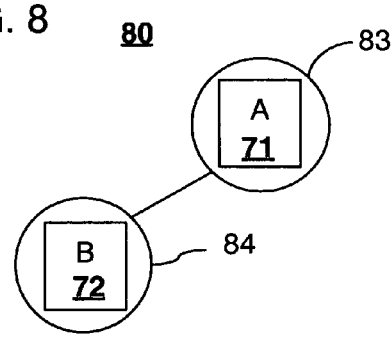
FIG. 8 is an I-Set tree representation of the design abstraction hierarchy of FIG. 7 in accordance with the present invention.
Figure 7A:
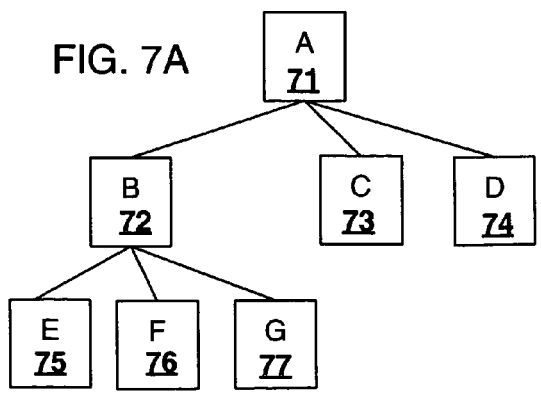
FIG. 7A is a conventional design abstraction hierarchy of the sample design of FIG. 7.

Referring to FIG. 7A, a packed view of the design 70 in FIG. 7 is shown. The block membership in the packed view is explicit. Blocks E (75), F (76), and G (77), are part of block B (72), while Block B, C (73), and D (74) belong to block A (71). Using I-Sets as shown in FIG. 8, a designer no longer needs to specify the complete block listing and can instead use a design hierarchy and convey block membership with a single block and its block descendants. If a block is a member of an I-Set node, then it is implied that all of its descendents are also members of this I-Set node unless a descendent is a member of another I-Set node. There are two generalizations of how block memberships are specified for an I-Set node. In FIG. 8, the I-Set hierarchy 80 has two I-Set nodes 83 and 84. The root I-Set node 83 contains a single block A (71) and the child I-Set node 84 contains a single block B (72). The root I-Set node 83 block members are A, C, and D. Similarly, the child I-Set node block members are B, E, F, and G. Note that the two I-Set nodes for example can be formed at levels of hierarchy in a particular design. Further note that the root I-Set node 83 has explicit reference to block A while block members C and D have implicit membership that can be generated at run-time. Similarly, the child (or in this instance leaf) I-Set node 84 has explicit block member B and implicit block members E, F, and G.

Figure 9:
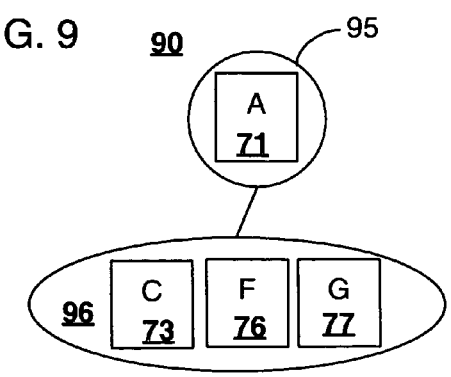
FIG. 9 is yet another I-Set tree representation of the design abstraction hierarchy of FIG. 7 in accordance with the present invention.

Referring to FIG. 9, an alternative I-Set hierarchy 90 is shown for the design 70 of FIGS. 7 and 7A also using two I-Set nodes 95 and 96. In this embodiment, the root I-Set node 95 has a single block A (71), and the child I-Set node contains explicit blocks C (73), F (76), and G (77). The root I-set node 95 includes block members A, B, D, and E while the child I-Set node 96 includes block members C, F, and G. Again, this example has a root I-set node with a single block that is a level of design hierarchy. The child I-Set node 96 contains blocks that do not correspond to a level of design hierarchy. The child I-Set node 96 spans two levels of hierarchy where blocks F and G are descendents of block B while block C is a child of block A. The root I-Set node 95 has explicit block member A while it has implicit members B, D, and E. Similarly, child or leaf node 96 has explicit block members C, F, and G and no implicit members.

Figure 10:
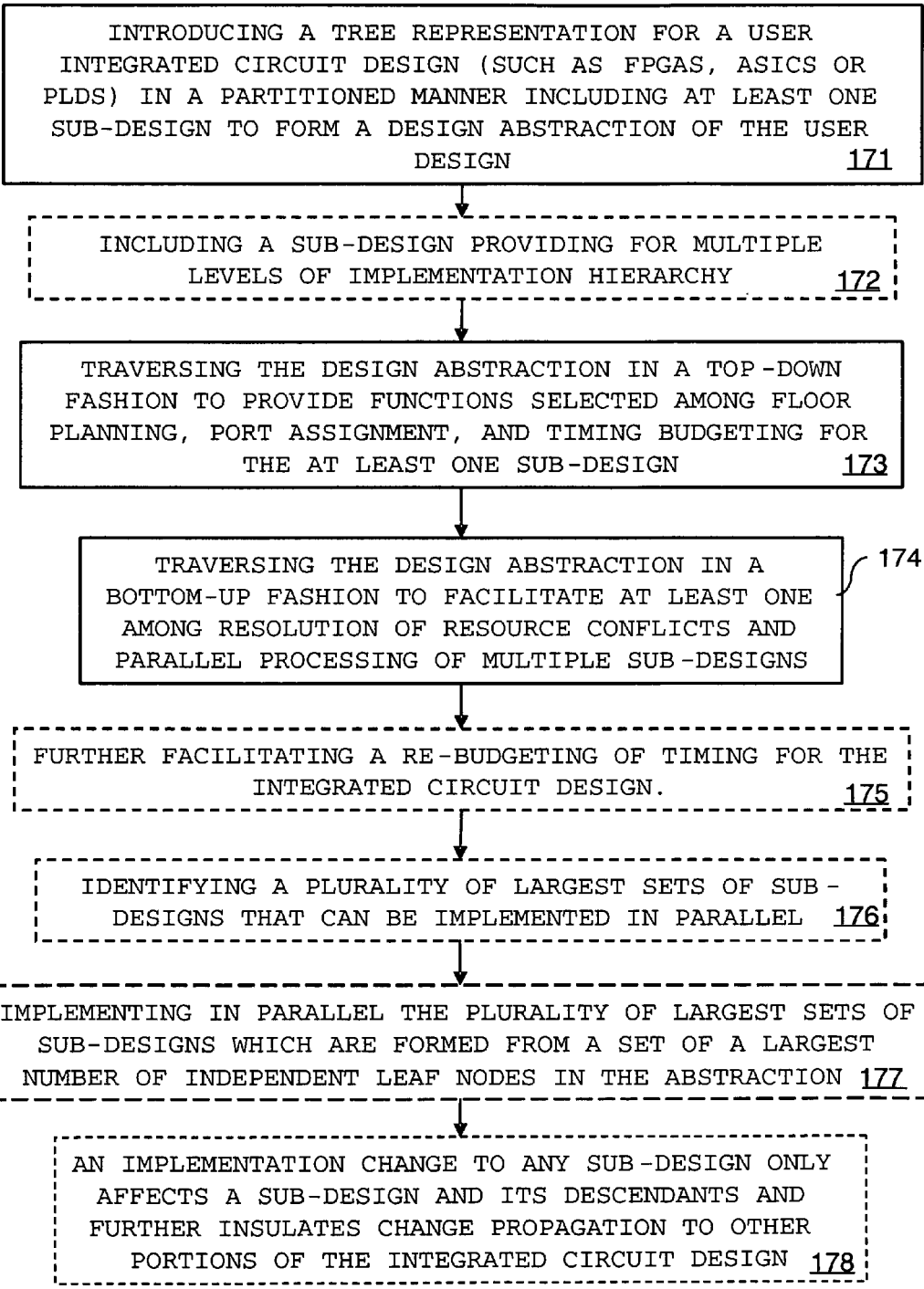
FIG. 10 is a flow chart illustrating a method of implementing an integrated circuit design in accordance with an embodiment of the inventive arrangements disclosed herein.

Given an implementation tree introduced in a tree representation for a user IC design in a partitioned manner including at least one sub-design to form a design abstraction of the user design at step 171 of method 170 in FIG. 10, an exemplary embodiment can use the breadth-first and depth-first traversal methods at steps 173 and 174 to traverse the tree nodes. Note that the tree representation can include a sub-design providing for multiple levels of implementation hierarchy at step 172. The breadth-first traversal corresponds to the top-down design implementation methodology of step 173 where the parent sub-design is processed before its child sub-designs to provide one or more functions among floor planning, port assignment, or timing budgeting for at least one sub-design. An example of scenarios where breadth-first traversal is needed is the timing-budgeting of the sub-designs. When a tree node is visited during the breadth-first traversal, the timing constraints of the corresponding sub-design are budgeted and the resultant finer timing constraints are applied to its child sub-designs. On the contrary, the depth-first traversal corresponds to the bottom-up design implementation methodology at step 174 where the parent sub-design cannot be processed before all its child sub-designs are processed. The bottom-up traversal facilitates one or more among resolution of resource conflicts and parallel processing of multiple sub-designs. An example of scenarios where the depth-first traversal can be used is the implementation assembly process. When a tree node is visited during the depth-first traversal, the implementations of the child sub-designs are collected and assembled to form the implementation for the sub-design corresponding to the currently visited tree-node. Operations such as resolving resource conflicts at step 174 and timing re-budgeting at step 175 followed by re-implementing sub-designs are performed if needed.

It should be noted that the sub-designs represented by the tree nodes in the implementation tree do not have to be a user design module in the design hierarchy. One of the important use cases for implementation tree is to represent the clusters and their hierarchical relations obtained in the multi-level clustering process. The clusters are formed recursively during the clustering process so that components that are tightly coupled and/or are part of a timing critical path that can be bundled together and treated as one entity in the subsequent processes. These multi-level clustering processes usually breaks the boundary of the user design hierarchy in order to achieve the optimal clustering results. The resultant clusters and their hierarchical relations can be naturally represented as tree nodes and tree edges in the implementation tree. The subsequent implementation processes such as timing budgeting, automatic floor-planning, and interface pin assignment can be performed by following the ordering obtained by the breadth-first traversal of the tree. Moreover, the place-and-route process of individual clusters can be performed by following the ordering obtained by the depth-first traversal of the tree so that the child sub-designs are placed, routed, and validated before the parent sub-design is considered.

With the implementation tree representing the dependency relations among sub-designs, the design implementation process can be easily parallelized to process independent sub-designs at the same time. The maximum independent sub-designs are those whose corresponding tree nodes in the implementation tree are at the leaf level which can be identified at step 176 and implemented at step 177. These sub-designs can be implemented and validated in parallel to save the total implementation time. After these sub-designs are processed, then the next maximum independent sub-designs can be obtained by removing those implemented sub-designs from the implementation tree and again collecting those sub-designs whose tree nodes are at the leaf level. These sub-designs can again be implemented in parallel. If this same process is repeated until the entire implementation tree is removed, the entire design is, thus, implemented. As noted in step 178, any implementation change to any sub-design should only affect a sub-design and its descendants and further insulate further change propagation to other portions of the IC design.

Referring to FIG. 11, another similar method 200 is shown for implementing an IC design which includes the step 202 of expressing a desired hierarchical relationship in a form of parent-child pairs where a parent sub-design is dependent upon a child sub-design and the desired hierarchical relationship is a design abstraction of the IC design forming an implementation tree. The method 200 further includes the step 204 of traversing the design abstraction in a top-down fashion to provide functions selected among floor planning, port assignment, and timing budgeting for the at least one sub-design and the step 206 of traversing the design abstraction in a bottom-up fashion to facilitate at least one among resolution of resource conflicts and parallel processing of multiple sub-designs.

The method 200 can further include a number of additional optional steps such as the step 208 of traversing the design abstraction in the bottom-up fashion to further facilitate a re-budgeting of the timing for the IC design and then re-implementing a sub-design affected by attempts to resolve resource conflicts or re-budget of timing at step 210. As previously noted, the IC design can be divided into a plurality of sub-designs as indicated at step 212. The implementation tree should be defined using legally defined user selected sub-sets of sub-designs as noted at step 214. To implement identified independent sets in parallel at step 218, the sub-designs that are independent should be identified at step 216. An independent set has no node that is a descendent of another node in the same set. At step 220, tool-generated clusters can be recursively formed in cases where sub-designs are tightly coupled or where sub-designs contain a portion of a critical timing path.

The methods disclosed herein can be implemented by a software-based circuit design tool that can receive, guide, synthesize, technology-map, pack, place, and route a circuit design representation. As is known, placing refers to assigning components of a circuit design to physical locations on a chip and routing refers to routing signals, or forming connections, between components of the circuit design.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of implementing a user integrated circuit design, comprising the steps of:
    introducing a plurality of tree representations for the user integrated circuit design in a partitioned manner including at least one sub-design to form a design abstraction of the user design;
    wherein at least one node in one of the plurality of tree representations represents one of a sub-design module and a user floor-planned partition, at least one node in one of the plurality of tree representations represents a plurality of sub-design modules, at least one node in one of the plurality of tree representations represents a set of circuit primitives, and a dependency relationship between a pair of nodes in a tree is represented by a parent-child connection between the pair of nodes;
    traversing at least one of the plurality of tree representations in a top-down fashion to provide functions selected among floor planning, port assignment, and timing budgeting for the at least one sub-design; and
    traversing at least one of the plurality of tree representations in a bottom-up fashion to facilitate at least one among resolution of resource conflicts and parallel processing of multiple sub-designs.

2. The method of claim 1, wherein the method further comprises the step of identifying a plurality of largest sets of sub-designs that can be implemented in parallel.

3. The method of claim 2, wherein the method further comprises the step of implementing in parallel the plurality of largest sets of sub-designs which are formed from a set of a largest number of independent leaf nodes in the abstraction.

4. The method of claim 1, wherein the user integrated circuit design is selected from the group comprising FPGAs, ASICs, and PLDs.

5. The method of claim 1, wherein the step of traversing the tree in the bottom-up fashion further facilitates a re-budgeting of timing for the integrated circuit design.

6. The method of claim 1, wherein the at least one sub-design further includes a sub-design providing for multiple levels of implementation hierarchy.

7. The method of claim 1, wherein an implementation change to any sub-design only affects a sub-design and its descendants and further insulates change propagation to other portions of the integrated circuit design.

8. An integrated circuit design implementation tool, comprising:
    a memory; and
    a processor programmed to implement an integrated circuit design using a plurality of implementation trees, each tree having a root with a plurality of nodes that represents an implementation hierarchy among sub-designs in a design abstraction of the integrated circuit design;
    wherein at least one node in one of the plurality of implementation trees represents one of a sub-design module and a user floor-planned partition, at least one node in one of the plurality of implementation trees represents a plurality of sub-design modules, at least one node in one of the plurality of implementation trees represents a set of circuit primitives, and a dependency relationship between a pair of nodes in an implementation tree is represented by a parent-child connection between the pair of nodes, and the processor is further programmed to:
    traverse at least one of the plurality of implementation trees in a top-down fashion to provide functions selected among floor planning, port assignment, and timing budgeting for the at least one sub-design;
    traverse at least one of the plurality of implementation trees in a bottom-up fashion to facilitate at least one among resolution of resource conflicts and parallel processing of multiple sub-designs.

* * * * *